(12) United States Patent
Liu et al.

(10) Patent No.: US 10,937,688 B2
(45) Date of Patent: *Mar. 2, 2021

(54) SEMICONDUCTOR PACKAGE AND METHOD OF FABRICATING SEMICONDUCTOR PACKAGE

(71) Applicant: Taiwan Semiconductor Manufacturing Co., Ltd., Hsinchu (TW)

(72) Inventors: Zi-Jheng Liu, Taoyuan (TW); Chen-Cheng Kuo, Shin-Chu County (TW); Hung-Jui Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 13 days.

This patent is subject to a terminal disclaimer.

(21) Appl. No.: 16/396,793

(22) Filed: Apr. 29, 2019

(65) Prior Publication Data

US 2019/0295884 A1 Sep. 26, 2019

Related U.S. Application Data

(63) Continuation of application No. 15/688,817, filed on Aug. 28, 2017, now Pat. No. 10,276,428.

(51) Int. Cl.
*H01L 23/053* (2006.01)
*H01L 21/768* (2006.01)
(Continued)

(52) U.S. Cl.
CPC .. *H01L 21/76807* (2013.01); *H01L 21/02645* (2013.01); *H01L 21/56* (2013.01); *H01L 21/78* (2013.01); *H01L 23/3114* (2013.01); *H01L 23/5329* (2013.01); *H01L 23/5384* (2013.01); *H01L 24/32* (2013.01); *H01L 2221/1015* (2013.01); *H01L 2224/0231* (2013.01); *H01L 2224/32225* (2013.01); *H01L 2924/14* (2013.01)

(58) Field of Classification Search
CPC ........ H01L 21/76807; H01L 21/02645; H01L 23/5329; H01L 23/5384; H01L 2221/1015; H01L 2224/0231
USPC ........................................... 257/758
See application file for complete search history.

(56) References Cited

U.S. PATENT DOCUMENTS 7,262,127 B2 * 8/2007 Ishikawa ........... H01L 21/76808
257/758
7,884,474 B2 * 2/2011 Kojima ............... H01L 21/7682
257/750

(Continued)

*Primary Examiner* — Nitin Parekh
(74) *Attorney, Agent, or Firm* — JCIPRNET

(57) ABSTRACT

A method of fabricating a semiconductor package includes providing a substrate having at least one contact and forming a redistribution layer on the substrate. The formation of the redistribution layer includes forming a dielectric material layer over the substrate and performing a double exposure process to the dielectric material layer. A development process is then performed and a dual damascene opening is formed in the dielectric material layer. A seed metallic layer is formed over the dual damascene opening and over the dielectric material layer. A metal layer is formed over the seed metallic layer. A redistribution pattern is formed in the first dual damascene opening and is electrically connected with the at least one contact.

15 Claims, 9 Drawing Sheets

(51) Int. Cl.
    *H01L 21/56*           (2006.01)
    *H01L 21/02*           (2006.01)
    *H01L 23/538*          (2006.01)
    *H01L 21/78*           (2006.01)
    *H01L 23/532*          (2006.01)
    *H01L 23/31*           (2006.01)
    *H01L 23/00*           (2006.01)

(56) References Cited

U.S. PATENT DOCUMENTS

| | | | |
|---|---|---|---|
| 2004/0222529 A1* | 11/2004 | Dostalik | H01L 21/76843 |
| | | | 257/758 |
| 2005/0032357 A1* | 2/2005 | Rantala | H01L 21/76802 |
| | | | 438/637 |
| 2005/0167842 A1* | 8/2005 | Nakamura | H01L 23/522 |
| | | | 257/758 |
| 2007/0004214 A1* | 1/2007 | Schaller | H01L 21/76802 |
| | | | 438/700 |
| 2007/0190778 A1* | 8/2007 | Shih | H01L 21/76808 |
| | | | 438/638 |
| 2011/0083887 A1* | 4/2011 | Brock | H01L 23/5329 |
| | | | 174/258 |
| 2012/0149204 A1* | 6/2012 | Hsieh | H01L 21/76813 |
| | | | 438/700 |
| 2015/0364394 A1* | 12/2015 | Lin | H01L 21/568 |
| | | | 257/734 |

* cited by examiner

SEMICONDUCTOR PACKAGE AND METHOD OF FABRICATING SEMICONDUCTOR PACKAGE

CROSS-REFERENCE TO RELATED APPLICATION

This application is a continuation application of and claims the priority benefit of a prior application Ser. No. 15/688,817, filed on Aug. 28, 2017, now pending. The entirety of the above-mentioned patent application is hereby incorporated by reference herein and made a part of this specification.

BACKGROUND

Packaging technologies for integrated circuits involve encapsulating an integrated circuit (IC) die in encapsulation material and building the required redistribution layer. The formation of fin-pitch redistribution layers allows for fabricating smaller packages with high integration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
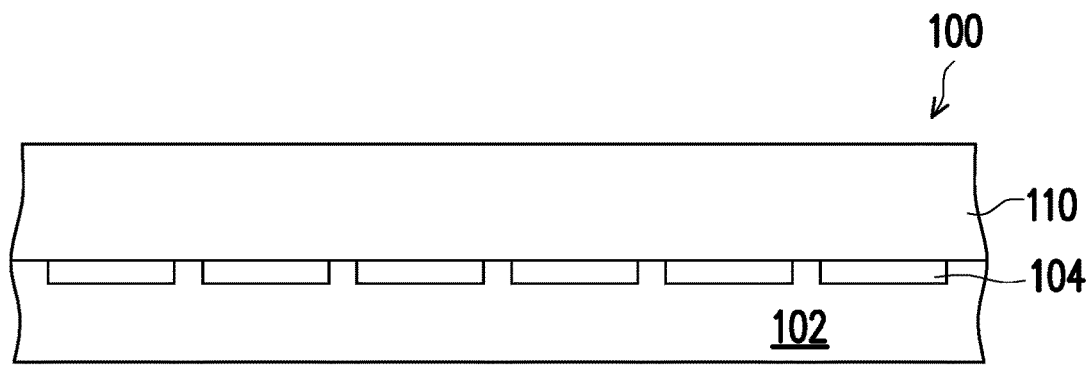
FIGS. 1-7 schematically illustrate various stages of processes for forming a redistribution layer according to a method of fabricating a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one component or feature's relationship to another component(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1-7 schematically illustrate various stages of processes for forming a redistribution layer according to a method of fabricating a semiconductor package in accordance with some embodiments. Referring to FIG. 1, a substrate 102 having a plurality of contacts 104 is provided. In some embodiments, a first dielectric material layer 110 is formed over the substrate 100 and covering the contacts 104. In some embodiments, the substrate 102 may include one or more semiconductor chips or plural dies of a semiconductor wafer or a reconstituted wafer. In certain embodiments, the substrate 102 is a reconstituted wafer including a plurality of dies molded in a molding compound. In some embodiments, the contacts 104 are contact pads or conductive pads of the die(s). In some embodiments, the substrate 102 may be a monocrystalline semiconductor substrate such as a silicon substrate, a silicon-on-insulator (SOI) substrate or a germanium-on-insulator (GOI) substrate, for example. In accordance with the embodiments, the semiconductor substrate may include other conductive layers, doped regions or other semiconductor elements, such as transistors, diodes or the like. The embodiments are intended for illustration purposes but not intended to limit the scope of the present disclosure.

Referring to FIG. 1, in some embodiments, the first dielectric material layer 110 may be formed by a coating process such as spin-coating process, or a deposition process including a chemical vapor deposition (CVD) process. In certain embodiments, the first dielectric material layer 110 may be a positive photo-sensitive material layer. In some embodiments, a material of the dielectric material layer 110 may be a positive type photo-sensitive material, including polyimide, benzocyclobutene (BCB), polybenzooxazole (PBO), or any other suitable photo-sensitive polymer materials or other photoresist materials. In certain embodiments, the material of the dielectric material layer 110 may be a positive photoresist material, and the positive photoresist materials may be H-line, I-line, wide-band or deep-UV photoresist materials.

Figure 2:
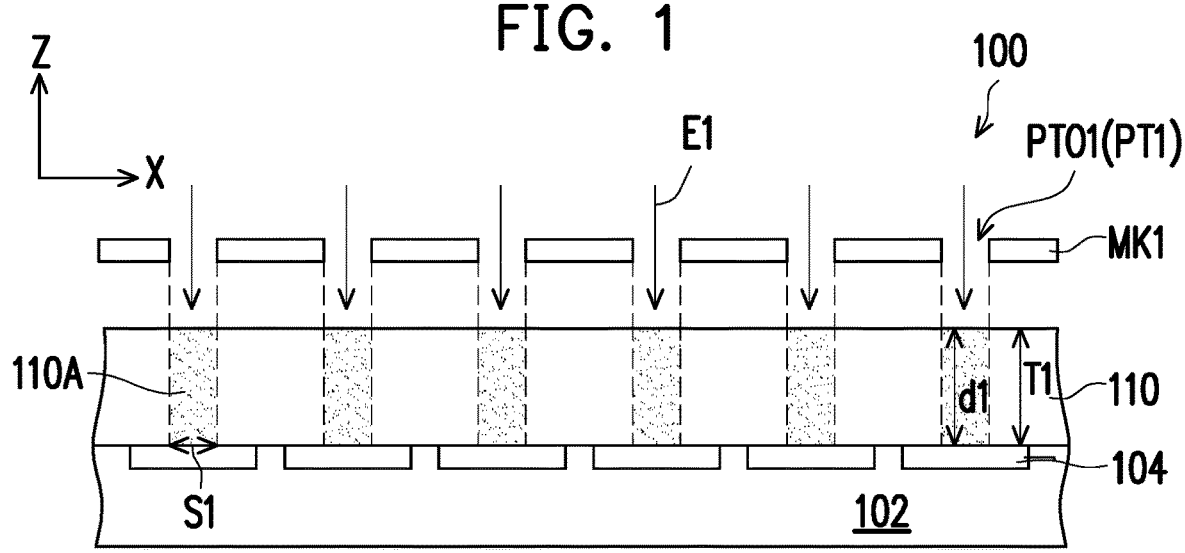

Referring to FIG. 2, a first exposure process E1 is performed to the first dielectric material layer 110 to form first exposure portions 110A. In some embodiments, the first exposure process E1 is performed using a mask MK1 with a first pattern PT1, with light or illumination (as arrows) radiated from a light source (not shown) passing through the mask MK1. In some embodiments, the first pattern PT1 includes a plurality of openings PTO1. In certain embodiments, the image of the first pattern PT1 is transferred to the first dielectric material layer 110 through the first exposure process E1. In FIG. 2, the first dielectric material layer 110 is partially exposed by the light or illumination through the first exposure process E1, and the first exposure portions 110A are formed in the exposed regions (shown as the spotted regions) of the first dielectric material layer 110 exposed to the light passing through the openings PTO1. In some embodiments, by adjusting the energy level or energy dose of the energy source (i.e. light source) and/or the exposure time, the depth of the exposure regions (the depth that light can reach) may be accurately controlled. In some embodiments, the first exposure process E1 is performed with a first energy dose, and the first exposure portions 110A are formed with a depth d1 and a bottom size S1 in the horizontal direction x (perpendicular to the thickness direction z of the first dielectric material layer 110). In certain embodiments, the depth d1 of the first exposure portions 110A is substantially equivalent to a thickness T1 of the first dielectric material layer 110. In certain embodiments, the thickness T1 of the first dielectric material layer 110 ranges from about 10 microns to about 30 microns, and the first energy dose ranges from about 50 mJ/cm$^2$ to about 100 mJ/cm$^2$. In some embodiments, the first exposure portions 110A constitute a latent pattern and the latent pattern is a reproduce of the first pattern PT1. That is, the locations and shapes of the first exposure portions 110A correspond to and simulate substantially the locations and shapes of the openings PTO1. In some embodiments, the latent pattern of the first exposure portions 110A includes a via-opening pattern. In accordance with the embodiments, the image of the pattern(s) of the mask will be transferred fully or partially to the target material layer or structure in any specific ratio for amplification or reduction purposes. The embodiments are intended for illustration purposes but not intended to limit the scope of the present disclosure.

For the positive photo-sensitive material or positive photoresist material, exposure to light of a suitable wavelength (which is material dependent) leads to chemical reactions of the positive photo-sensitive material or positive photoresist material, and the treated portions will become more soluble or be much easier to be removed during the subsequently development process. In some embodiments, as the first dielectric material layer 110 is a positive photo-sensitive material layer, the first exposure portions 110A of the first dielectric material layer 110 are chemically reacted and become soluble during the subsequently development process.

Figure 3:
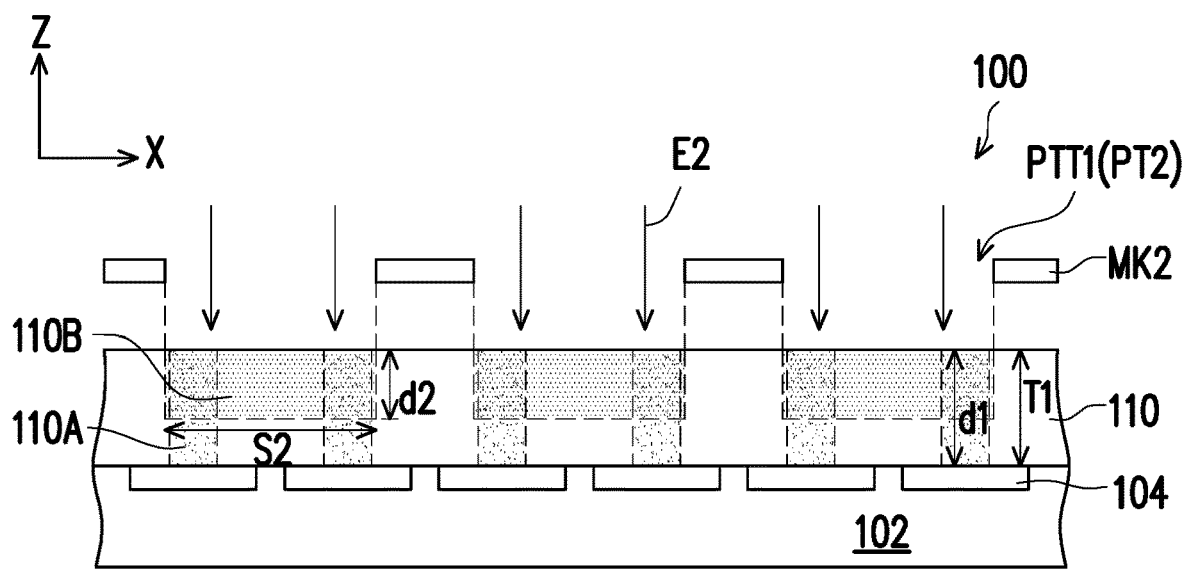

Referring to FIG. 3, a second exposure process E2 is performed to the first dielectric material layer 110 to form second exposure portions 110B. In some embodiments, the second exposure process E2 is performed using a mask MK2 with a second pattern PT2, with light or illumination (as arrows) passing through the mask MK2. In some embodiments, the masks MK1, MK2 may refer to different portions of the same mask or two masks. In some embodiments, the second pattern PT2 includes a plurality of openings PTT1. In certain embodiments, the image of the second pattern PT2 is transferred to the first dielectric material layer 110 through the second exposure process E2. In FIG. 3, the first dielectric material layer 110 is partially exposed by the light or illumination through the second exposure process E2, and the second exposure portions 110B are formed in the exposed regions (shown as the spotted regions) of the first dielectric material layer 110 exposed to the light passing through the openings PTT1. In certain embodiments, the locations and shapes of the second exposure portions 110B correspond to and simulate substantially the locations and shapes of the openings PTT1. In some embodiments, the second exposure process E2 is performed with a second energy dose and the second exposure portions 110B are formed with a depth d2 and a bottom size S2 in the horizontal direction x (perpendicular to the thickness direction z of the first dielectric material layer 110). In certain embodiments, the depth d2 of the second exposure portions 110B is smaller than the thickness T1 of the first dielectric material layer 110. In certain embodiments, the depth d2 of the second exposure portions 110B is smaller than the depth d1 of the first exposure portions 110A. In one embodiment, the second energy dose is lower than the first energy dose. In some embodiments, the second energy dose ranges from about 50 mJ/cm$^2$ to about 100 mJ/cm$^2$. In some embodiments, the second exposure portions 110B constitute a latent pattern and the latent pattern is a reproduce of the second pattern PT2. In some embodiments, the ratio of depth d2/d1 may be about 0.4~0.6. In some embodiments, the locations of the first exposure portions 110A are overlapped with the locations of parts of the second exposure portions 110B. In some embodiments, the latent pattern of the second exposure portions 110B includes a trench-opening pattern.

In some embodiments, the first exposure process E1 and the second exposure process E2 can be considered as a double exposure process. In certain embodiments, only one photo-sensitive dielectric material layer is needed for such double exposure process, the process steps of such double exposure process are much simplified when compared with conventional photolithographic exposure processes performed twice, thus lowering the costs and saving time for the formation of the redistribution layer (RDL).

In some embodiments, by performing two consecutive exposure processes, better exposure alignment for the patterns and more accurate pattern overlay (especially RDL to the vias) can be achieved. In certain embodiments, the same mask is used for performing the two consecutive exposure processes, only once mask alignment is required and no extra alignment is required and better pattern overlay is attained.

Figure 4:
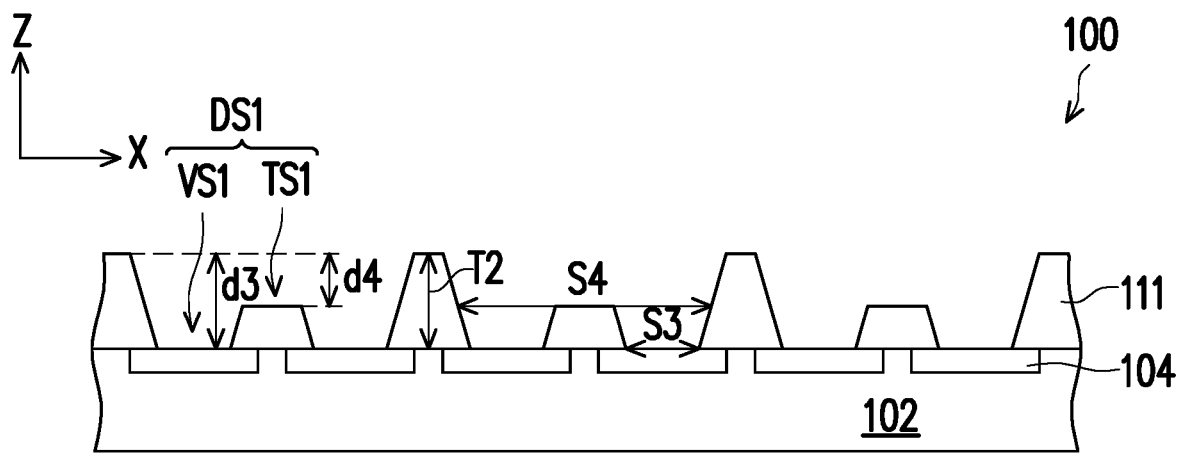

In FIG. 4, in some embodiments, a first development process is conducted to remove the first and second exposure portions 110A, 110B of the first dielectric material layer 110, and the first dielectric pattern 111 is formed, thus implementing the pattern transfer of masks MK1, MK2. In some embodiments, the first development process includes applying a developer solution to dissolve or remove at least the exposed regions during the first and second exposure processes E1, E2 (i.e. the first and second exposure portions 110A, 110B) so as to expose the underlying contacts 104. For example, the developer solution includes solutions of tetramethyl ammonium hydroxide (TMAH). In some embodiments, the developed first dielectric pattern 111 is then cured under 200-250 degrees Celsius. In some embodiments, the first and second exposure portions 110A, 110B may be removed simultaneously by the same development process. In certain embodiments, following the removal of at least the first and second exposure portions 110A, 110B, the trench openings TS1 with the depth d4 and the via openings VS1 with the depth d3 are formed and the first dielectric pattern 111 having the thickness T2 is formed. In some embodiments, film loss may occur during the first development process and the thickness T2 of the first dielectric pattern 111 is smaller than the thickness T1 of the first dielectric material layer 110. In certain embodiments, the trench openings TS1 and the via openings VS1 correspondingly and spatially communicated with the trench openings TS1 constitute dual damascene openings or damascene openings DS1. In some embodiments, only some of trench openings TS1 are connected with some of the via openings VS1 to form the damascene openings DS1. In some embodiments, some of trench openings TS1 are not connected with some of the via openings VS1.

In some embodiments, in addition to the removal of the first and second exposure portions 110A, 110B, the first development process may include over-developing the first dielectric material layer 110 by removing the first dielectric material layer 110 excessively around the first and second exposure portions 110A, 110B to form the via openings VS1 and trench openings TS1 as well as the damascene openings DS1 as shown in FIG. 4. In some embodiments, similar to the isotropic etching process, the over-developing of the first dielectric material layer 110 further widen the openings. In addition, a curing process may be included to cure the first dielectric material layer 110, and the curing of the first dielectric material layer 110 makes the sidewalls of the openings inclined. In some embodiments, owing to the over-developing and curing, the via opening VS1 is formed with a depth d3 and a bottom size S3 in the horizontal direction x (perpendicular to the thickness direction z), and the trench opening TS1 is formed with a depth d4 and a bottom size S4 in the horizontal direction x. In some embodiments, the trench openings TS1, the via openings VS1 and the damascene openings DS1 become tapering with slanted sidewalls. In some embodiments, the bottom size S3 of the via openings VS1 is larger than the bottom size S1 of the first exposure portions 110A. In some embodiments, the bottom size S4 of the trench openings TS1 is larger than the bottom size S2 of the second exposure portions 110B. In some embodiments, the depth d3 is smaller than the depth d1, while the depth d4 is smaller than the depth d2. In some embodiments, the ratio of depth d4/d3 may be about 0.4~0.6. In some embodiments, the ratio of bottom sizes S3/S1 is equivalent to 1.5 or larger than 1.5. In some embodiments, the ratio of bottom sizes S4/S2 is equivalent to 1.5 or larger than 1.5. In some embodiments, the via opening VS1 is a round shaped opening and the bottom size S3 of the via opening VS1 is the largest dimension or the diameter of the via opening VS1. In some embodiments, the trench opening TS1 is a strip trench and the bottom size S4 of the trench opening TS1 is the largest dimension or the length in the length direction (marked as direction x in FIG. 4).

Figure 5:
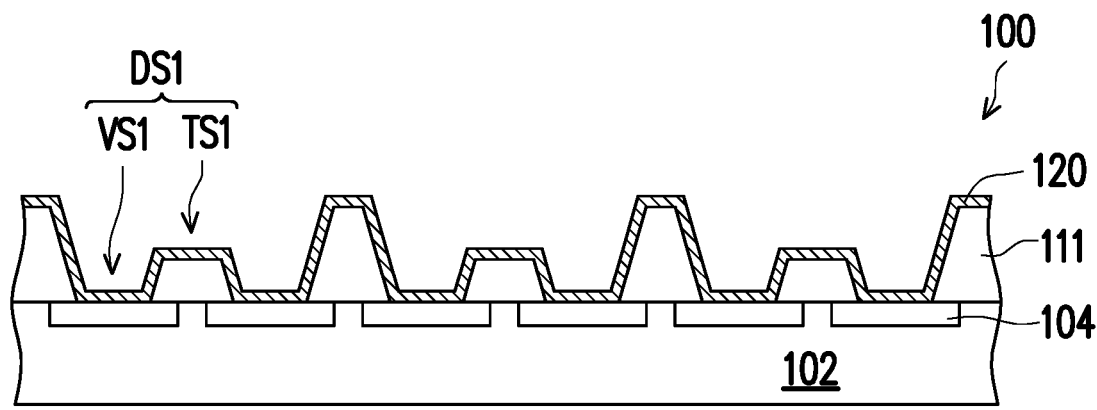

Referring to FIG. 5, in some embodiments, a first seed metallic layer 120 is formed over the first dielectric pattern 111 having damascene openings DS1 and on the contacts 104. In some embodiments, the first seed metallic layer 120 is formed conformal to the profiles of the first dielectric pattern 111 with damascene openings DS1, evenly covering the sidewalls and bottom surfaces of the damascene openings DS1 and the top surface of the first dielectric pattern 111. In certain embodiments, the first seed metallic layer 120 is formed by chemical vapor deposition (CVD), physical vapor deposition (PVD), atomic layer deposition (ALD), high density plasma CVD (HDPCVD) or combinations thereof. In certain embodiments, the first seed metallic layer 120 is formed by sequentially depositing or sputtering a titanium layer and a copper layer (not shown) conformal to the first dielectric pattern 111 and the damascene openings DS1. In one embodiment, the first seed metallic layer 120 covers and is in contact with the exposed surfaces of the contacts 104 (i.e. bottom surfaces of the via openings VS1). In certain embodiments, for the trench openings TS1 that are not connected with the via openings VS1, the first seed metallic layer 120 is formed conformally covering the sidewalls and bottom surfaces of the trench openings TS1. Owing to the slant or inclined sidewalls of the openings TS1, VS1 or DS1, better and more uniform step coverage may be achieved, especially for the first seed metallic layer 120 formed by sputtering. Hence, the reliability and electrical performance of the redistribution layer/structure are further improved.

Figure 6:
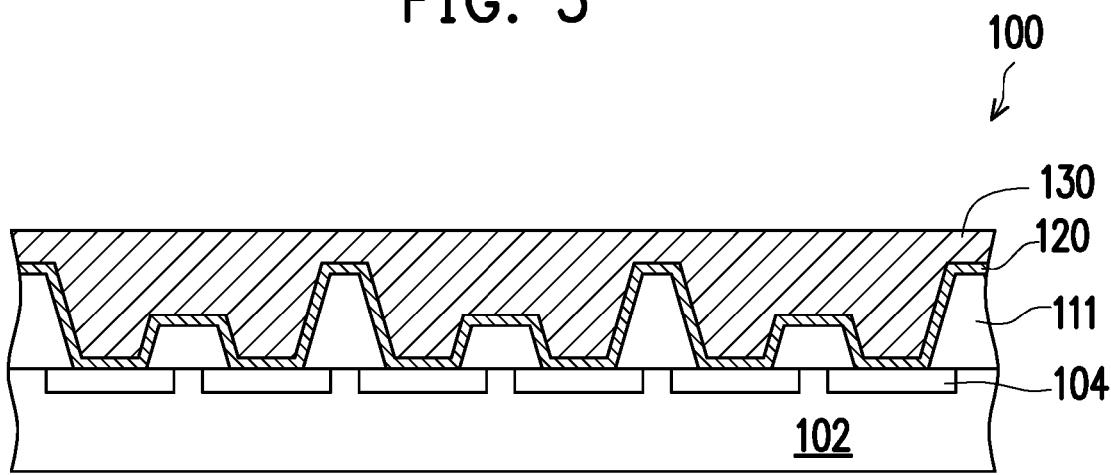

Referring to FIG. 6, a first metal layer 130 is formed to fill up the damascene openings DS1 and on the first seed metallic layer 120 over the first dielectric pattern 111. In some embodiments, the formation of the first metal layer 130 including forming a copper layer or a copper alloy layer (not shown) by electroplating to fill the damascene openings DS1 and on the first seed metallic layer 120 over the first dielectric pattern 111. However, it is appreciated that the scope of this disclosure is not limited to the materials and descriptions disclosed above. In certain embodiments, for the trench openings TS1 that are not connected with the via openings VS1, the first metal layer 130 is formed filling up the trench openings TS1.

In some embodiments, as a conformal seed layer is formed before filling the metal layer into the openings, better adhesion is ensured for the later formed metal layer. Moreover, the conformal seed layer may assist lowering the resistance and improving electrical properties for the redistribution layer.

Figure 7:
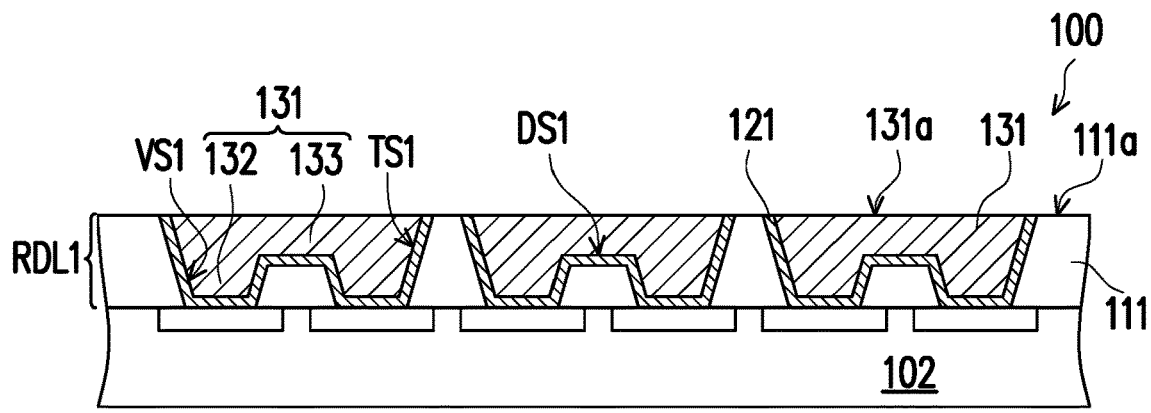

Referring to FIG. 7, a planarization process is performed to partially remove the first metal layer 130 and the first seed metallic layer 120 above the top surface 111a of the first dielectric pattern 111. In some embodiments, the first metal layer 130 along with the first seed metallic layer 120 above the top surface 111a of the first dielectric pattern 111 are removed until the top surface 111a of the first dielectric pattern 111 is exposed, and first seed metallic patterns 121 and dual damascene redistribution patterns 131 filled within the damascene openings DS1 are formed. In some embodiments, the planarization process may include a chemical-mechanical polishing (CMP) process, a mechanical grinding process, a fly cutting process or an etching back process. In some embodiments, the planarization process may include a chemical-mechanical polishing (CMP) process or a fly cutting process. In certain embodiments, after planarization, the formation of the first redistribution layer (RDL1) within the package structure 100 is completed. In some embodiments, after planarization, the first seed metallic layer 120 and the first metal layer 130 remained within the damascene openings DS1 become the first seed metallic patterns 121 and dual damascene redistribution patterns 131. In some embodiments, the first seed metallic pattern 121 is located with the damascene opening DS1, sandwiched between the dual damascene redistribution pattern 131 and the damascene openings DS1, and conformally covers the sidewalls and bottom surface of the damascene openings DS1. In some embodiments, the first seed metallic pattern 121 located with the damascene opening DS1 is formed as an integral piece as the first seed metallic patterns 121 are formed from the same layer (first seed metallic layer 120).

In some embodiments, the first redistribution layer RDL1 includes at least the first dielectric pattern 111, the first seed metallic patterns 121 and the dual damascene redistribution patterns 131. The first redistribution layer RDL1 is electrically connected with the contacts 104 of the substrate 102. In alternative embodiments, the first redistribution layer RDL1 may include more than one dielectric patterns and various types of redistribution patterns including traces or connection lines. In exemplary embodiments, the layout of the redistribution patterns of the first redistribution layer RDL1 may form fan-out routings for an integrated fan-out (InFO) package structure.

In some embodiments, the dual damascene redistribution pattern 131 located with the damascene opening DS1 includes via portions 132 (located within the via openings VS1) and routing portions 133 (located within the trench openings TS1). In some embodiments, the top surface 111a of the first dielectric pattern 111 is coplanar with and flush with the top surfaces 131a of the dual damascene redistribution patterns 131. In certain embodiments, for the trench openings TS1 that are not connected with the via openings VS1, after planarizing the first metal layer filling up the trench openings TS1, trace patterns (not shown) remained in the trench openings TS1 are obtained.

In certain embodiments, following the above process steps, the first redistribution layer is accomplished without using photolithographic processes and etching processes, thus avoiding the issues of photoresist peeling or swelling. In some embodiments, using the double exposure process described above, better pattern overlay and better pattern alignment are offered and damascene openings including via openings and trench openings are formed. In certain embodiments, through the formation of the damascene openings, filling capability of the metal layer into the damascene openings is improved and better adhesion between the damascene openings and the dual damascene redistribution patterns is provided through first seed metallic patterns 121 formed there-between.

FIGS. 8-14 schematically illustrate various stages of processes for forming another redistribution layer according to a method of fabricating a semiconductor package in accordance with some embodiments.

Figure 8:
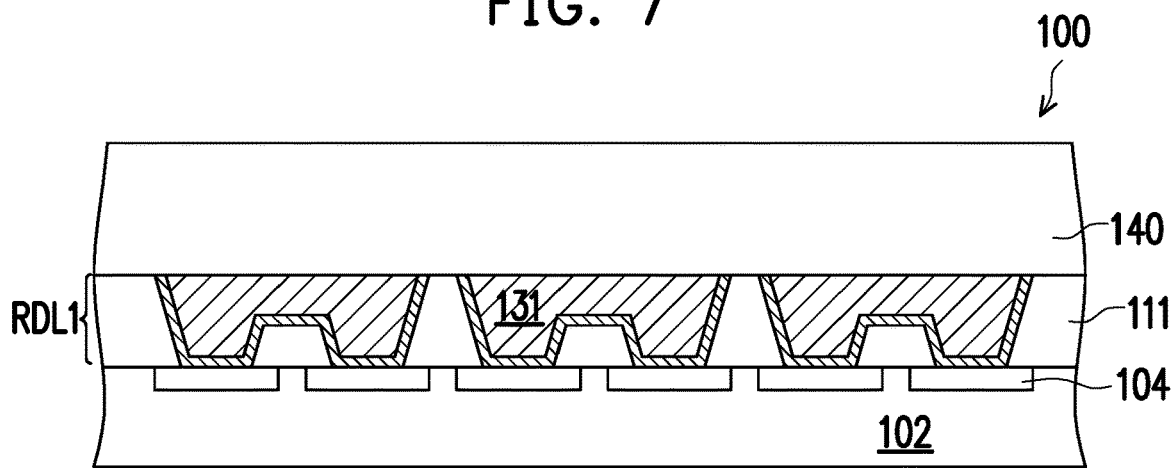
FIGS. 8-14 schematically illustrate various stages of processes for forming another redistribution layer according to a method of fabricating a semiconductor package in accordance with some embodiments.

Referring to FIG. 8, in some embodiments, a second dielectric material layer 140 may be formed on the first redistribution layer RDL1. The first redistribution layer RDL1 may be formed following some or all processes as described in FIGS. 1-7. In some embodiments, the second dielectric material layer 140 may be formed by a coating process such as a spin-coating process, or a deposition process including a CVD process. In certain embodiments, the second dielectric material layer 140 may be a positive type photo-sensitive material layer. In some embodiments, a material of the dielectric material layer 140 may be a positive photo-sensitive material, including polyimide, BCB, PBO, or any other suitable photo-sensitive polymer materials or other photoresist materials. In certain embodiments, the material of the dielectric material layer 140 may be positive photoresist materials. In some embodiments, the material of the second dielectric material layer 140 is the same as that of the first dielectric material layer 110. In some embodiments, the material of the second dielectric material layer 140 is different from that of the first dielectric material layer 110.

Figure 9:
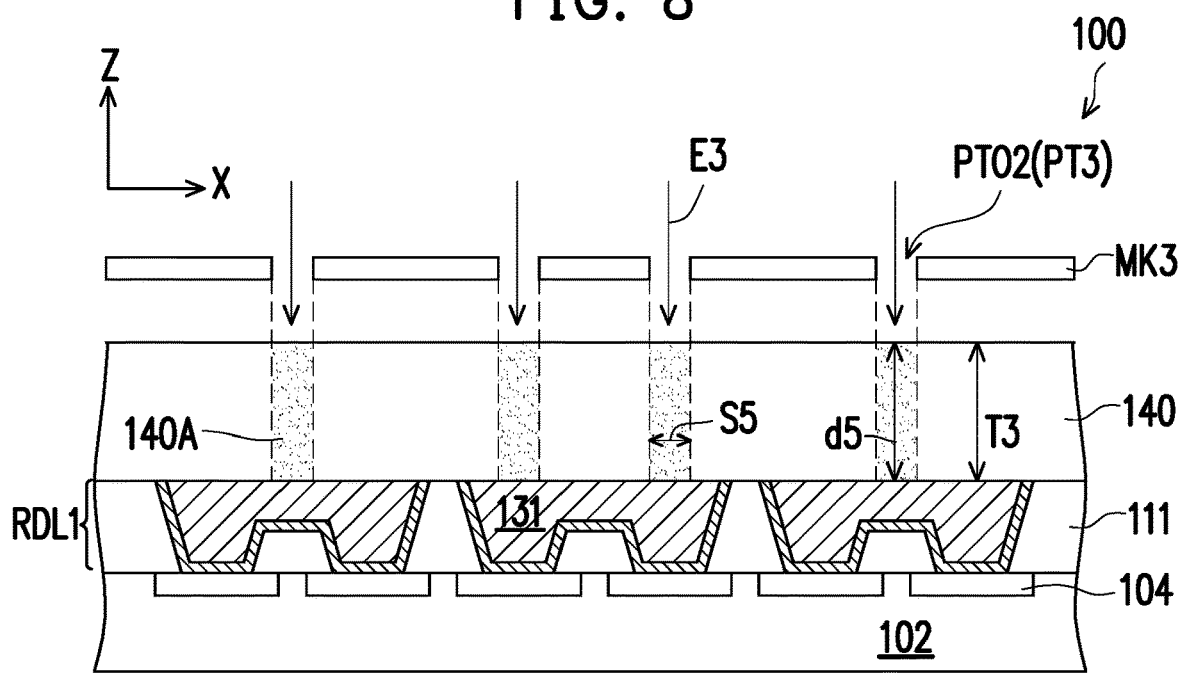

Referring to FIG. 9, a third exposure process E3 is performed to the second dielectric material layer 140 to form third exposure portions 140A. In some embodiments, the third exposure process E3 is performed using a mask MK3 with a third pattern PT3. In some embodiments, the third exposure portions 140A are formed in the exposed regions (shown as the spotted regions) of the second dielectric material layer 140 exposed to the light passing through the openings PTO2. The third exposure process E3 may be performed under similar or same conditions as described in the first exposure process E1, and will not repeated herein. In some embodiments, the third exposure process E3 is performed with a third energy dose, and the third exposure portions 140A are formed with a depth d5 and a bottom size S5 in the horizontal direction x (perpendicular to the thickness direction z of the second dielectric material layer 140). In certain embodiments, the depth d5 of the third exposure portions 140A is substantially equivalent to a thickness T3 of the second dielectric material layer 140. In certain embodiments, the latent pattern of the third exposure portions 140A includes a via-opening pattern. In accordance with the embodiments, the pattern of the third exposure portions 140A is different from the pattern of the first exposure portions 110A. The embodiments are intended for illustration purposes but not intended to limit the scope of the present disclosure.

Figure 10:
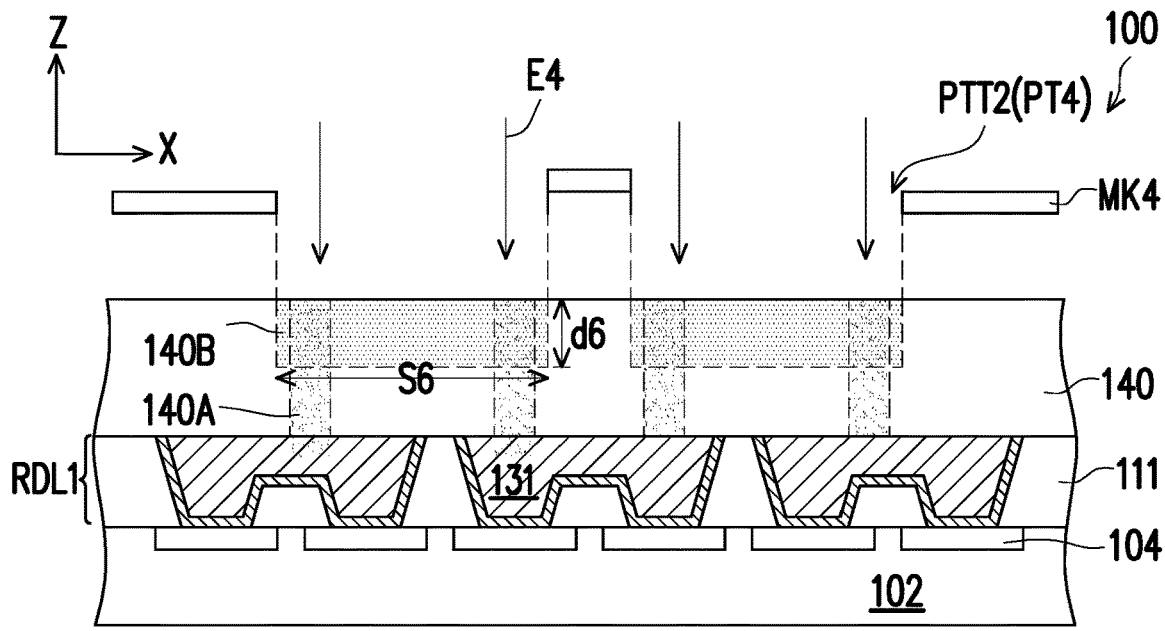

Referring to FIG. 10, a fourth exposure process E4 is performed to the second dielectric material layer 140 to form fourth exposure portions 140B. In some embodiments, the fourth exposure process E4 is performed using a mask MK4 with a fourth pattern PT4. In some embodiments, the masks MK3, MK4 may refer to different portions of the same mask or two masks. The fourth exposure process E4 may be performed under similar or same conditions as described in the second exposure process E2, and will not repeated herein. In FIG. 10, the second dielectric material layer 140 is partially exposed by the fourth exposure process E4, and the fourth exposure portions 140B are formed in the exposed regions (shown as the spotted regions) of the second dielectric material layer 140 exposed to the light passing through the openings PTT2 of the fourth pattern PT4. In some embodiments, the fourth exposure process E4 is performed with a fourth energy dose and the fourth exposure portions 140B are formed with a depth d6 and a bottom size S6 in the horizontal direction x (perpendicular to the thickness direction z). In certain embodiments, the depth d6 of the fourth exposure portions 140B is smaller than the thickness T3 of the second dielectric material layer 140. In certain embodiments, the depth d6 of the fourth exposure portions 140B is smaller than the depth d5 of the third exposure portions 140A. In one embodiments, the fourth energy dose is lower than the third energy dose. In some embodiments, the ratio of depth d6/d5 may be about 0.4~0.6. In some embodiments, the locations of the third exposure portions 140A are overlapped with the locations of parts of the fourth exposure portions 140B. In some embodiments, the latent pattern of the fourth exposure portions 140B includes a trench-opening pattern.

In some embodiments, the third exposure process E3 and the fourth exposure process E4 can be considered as another double exposure process.

Figure 11:
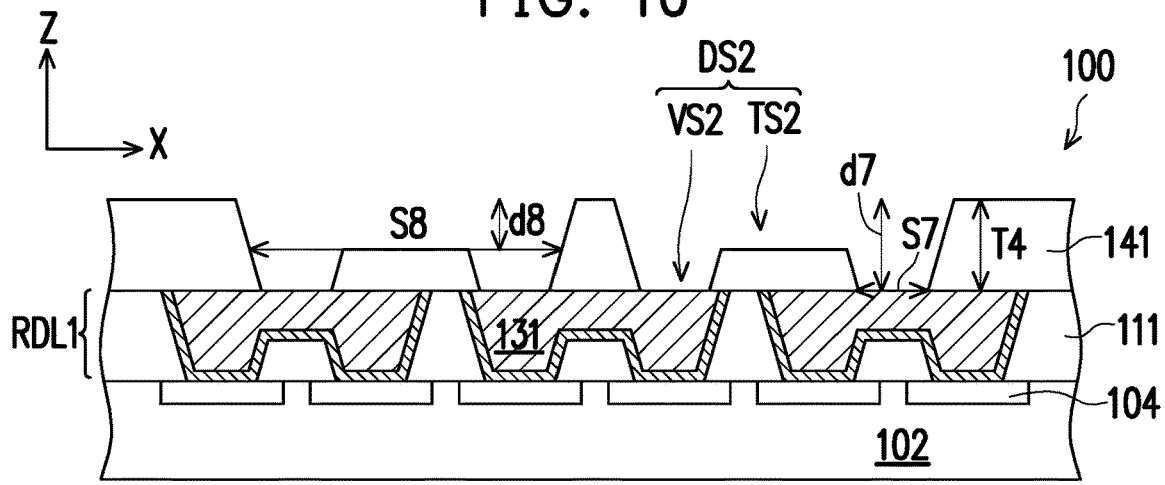

In FIG. 11, in some embodiments, a second development process is conducted to remove at least the third and fourth exposure portions 140A, 140B of the second dielectric material layer 140, and the second dielectric pattern 141 is formed. The second development process may be performed using similar or same conditions or materials as described in the first development process, and will not repeated herein. In some embodiments, the third and fourth exposure portions 140A, 140B may be removed simultaneously by the same development process. In certain embodiments, following the removal of at least the third and fourth exposure portions 140A, 140B, the trench openings TS2 with a depth d8 and the via openings VS2 with a depth d7 are formed and the second dielectric pattern 141 having the thickness T4 is formed. In some embodiments, film loss may occur during the second development process and the thickness T4 of the second dielectric pattern 141 is smaller than the thickness T3 of the second dielectric material layer 140. In certain embodiments, the trench openings TS2 and the via openings VS2 correspondingly and spatially communicated with the trench openings TS2 constitute dual damascene openings or damascene openings DS2. In some embodiments, some of trench openings TS2 are connected with some of the via openings VS2. In some embodiments, some of trench openings TS2 are not connected with some of the via openings VS2.

In some embodiments, other than the removal of the third and fourth exposure portions 140A, 140B, the second development process may include over-developing the second dielectric material layer 140 by removing the second dielectric material layer 140 excessively around the third and fourth exposure portions 140A, 140B to form the via openings VS2 and trench openings TS2 as well as the damascene openings DS2. In some embodiments, the over-developing of the second dielectric material layer 140 further widen the openings. In addition, a curing process may be included, and the curing of the second dielectric material layer 140 makes the sidewalls of the openings inclined. In some embodiments, owing to the widening effect of over-developing, the via opening VS2 is formed with a bottom size S7 (in the horizontal direction x) wider than the bottom size S5 of the third exposure portions 140A, and the trench opening TS2 is formed with a bottom size S8 (measuring at the depth d8 in the horizontal direction x) wider than the bottom size S6 of the fourth exposure portions 140B. In some embodiments, the trench openings TS2, the via openings VS2 and the damascene openings DS2 become tapering with slanted sidewalls after the curing process. In some embodiments, the depth d7 is smaller than the depth d5, while the depth d8 is smaller than the depth d6. In some embodiments, the ratio of depth d8/d7 may be about 0.4~0.6. In some embodiments, the ratio of bottom sizes S7/S5 ranges from 1.1 to 2. In some embodiments, the ratio of bottom sizes S8/S6 ranges from 1.1 to 2. In some embodiments, the via openings VS2 expose the underlying dual damascene redistribution patterns 131. In some embodiments, the via opening VS2 is a round shaped opening and the bottom size S7 of the via opening VS2 is the largest dimension or the diameter of the via opening VS2. In some embodiments, the trench opening TS2 is a strip trench and the bottom size S8 of the trench opening TS2 is the largest dimension or the length in the length direction (marked as direction x in FIG. 11).

Figure 12:
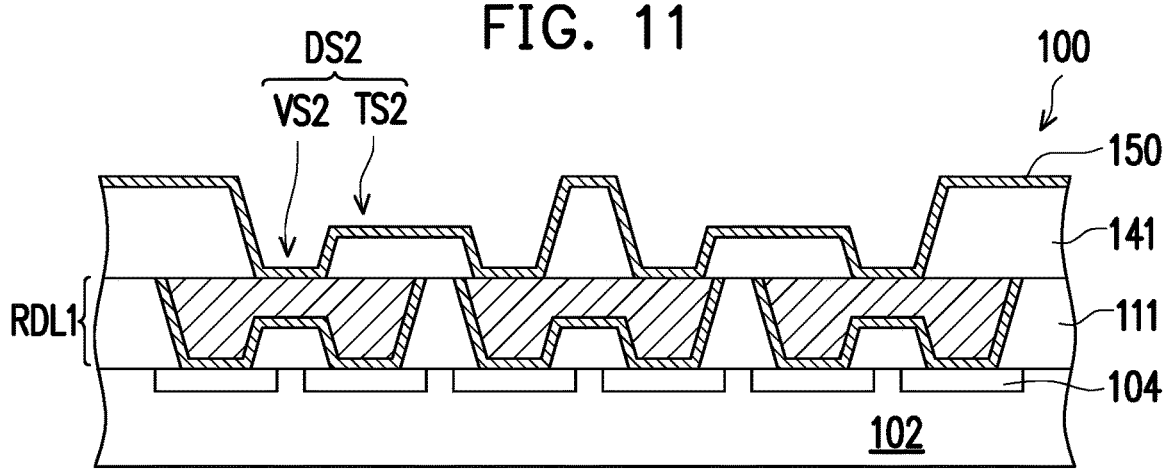

Referring to FIG. 12, in some embodiments, a second seed metallic layer 150 is formed over the second dielectric pattern 141 having damascene openings DS2. In some embodiments, the second seed metallic layer 150 is formed conformal to the profiles of the second dielectric pattern 141 with damascene openings DS2, evenly covering the sidewalls and bottom surfaces of the damascene openings DS2 and the top surface of the second dielectric pattern 141. In certain embodiments, the second seed metallic layer 150 is formed by sequentially depositing or sputtering a titanium layer and a copper layer (not shown) conformal to the second dielectric pattern 141 and the damascene openings DS2. In one embodiment, the second seed metallic layer 150 covers and is in contact with the exposed surfaces of the dual damascene redistribution patterns 131 (i.e. bottom surfaces of the via openings VS2). Owing to the slant or inclined sidewalls of the openings TS2, VS2 or DS2, better and more uniform step coverage may be achieved for the second seed metallic layer 150. Hence, the reliability and electrical performance of the redistribution layer/structure are further improved.

Figure 13:
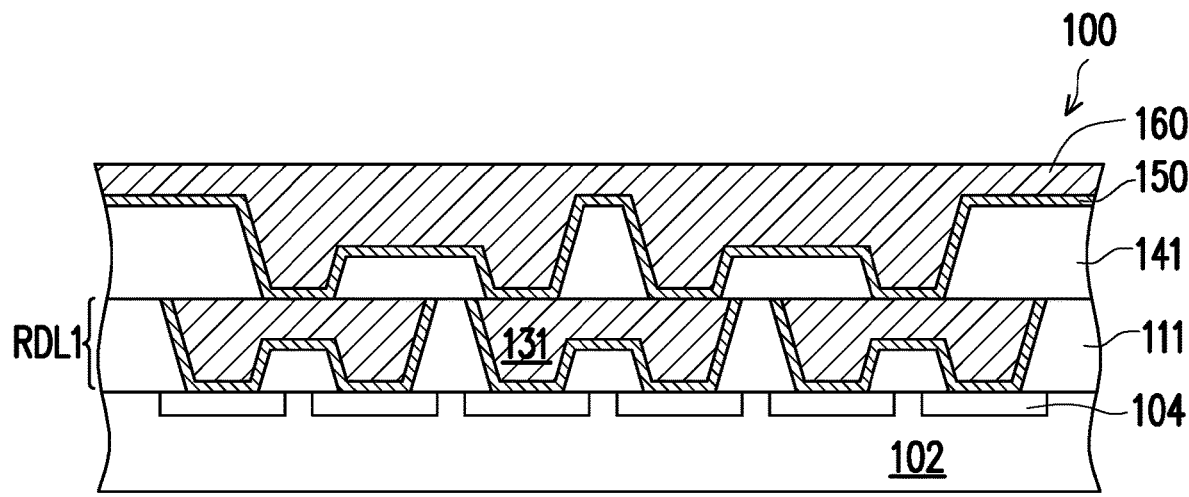

Referring to FIG. 13, a second metal layer 160 is formed to fill up the damascene openings DS2 and on the second seed metallic layer 150 over the second dielectric pattern 141. In some embodiments, the material of the second metal layer 160 includes copper or copper alloys. In some embodiments, the material of the second metal layer 160 is the same or different from that of the first metal layer 130.

Figure 14:
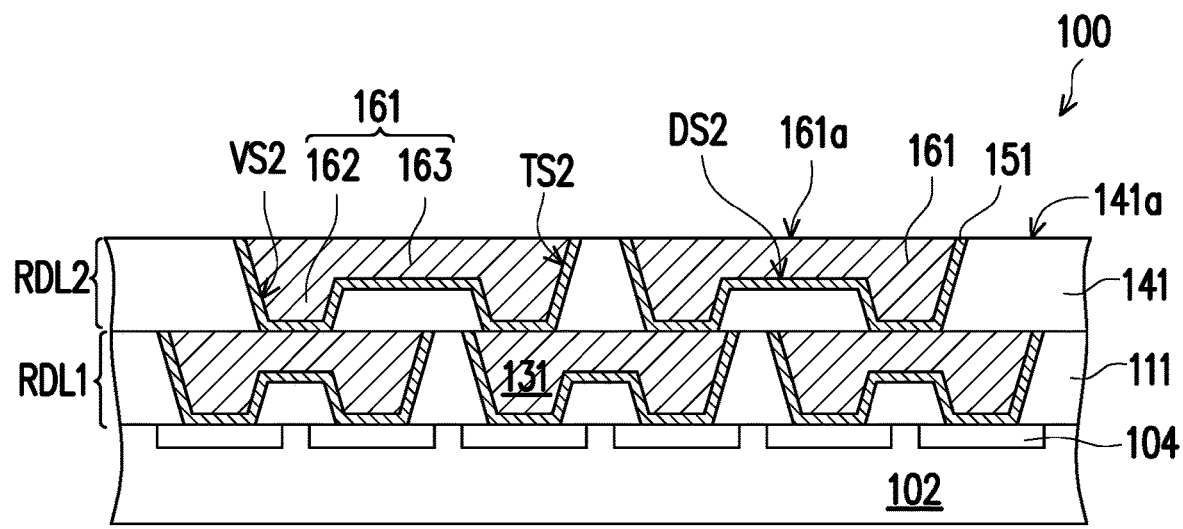

Referring to FIG. 14, a planarization process is performed to partially remove the second metal layer 160 and the second seed metallic layer 150 above the top surface 141a of the second dielectric pattern 141, and second seed metallic patterns 151 and dual damascene redistribution patterns 161 filled within the damascene openings DS2 are formed. In certain embodiments, after planarization, the formation of the second redistribution layer (RDL2) in the package structure 100 is completed. In some embodiments, the second seed metallic pattern 151 is located with the damascene opening DS2, sandwiched between the dual damascene redistribution pattern 161 and the damascene openings DS2, and conformally covers the sidewalls and bottom surface of the damascene openings DS2. In some embodiments, the second seed metallic pattern 151 is formed as an integral piece located with the damascene opening DS2. The second redistribution layer RDL2 is disposed on the first redistribution layer RDL1 and is electrically connected with the first redistribution layer RDL1.

In FIG. 14, the dual damascene redistribution pattern 161 located with the damascene opening DS2 includes via portions 162 (located within the via openings VS2) and routing portions 163 (located within the trench openings TS2).

Figure 15:
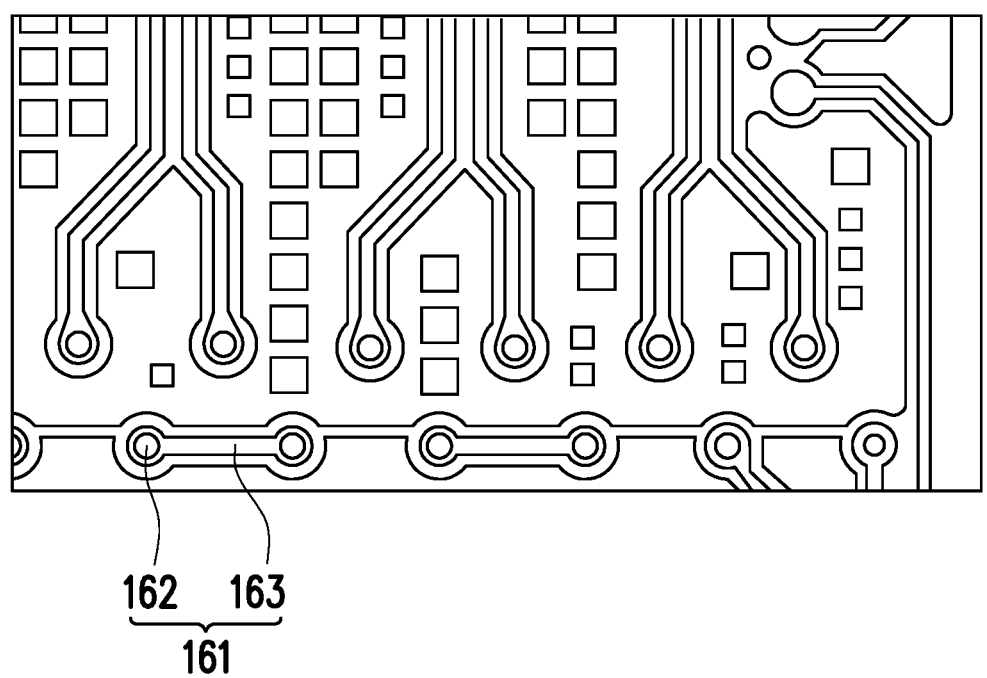
FIG. 15 illustrates a schematic layout top view of a redistribution layer in a semiconductor package in accordance with some embodiments.

FIG. 15 illustrates a schematic layout top view of a redistribution layer in a semiconductor package in accordance with some embodiments. In FIG. 15, more than one dual damascene redistribution patterns 161 are shown. In some embodiments, some of the dual damascene redistribution pattern 161 includes two via portions 162 connected through the routing portion 163 located in-between. However, the pattern of the dual damascene redistribution pattern or the layout of the redistribution layer is not limited by the embodiments described herein.

Figure 16:
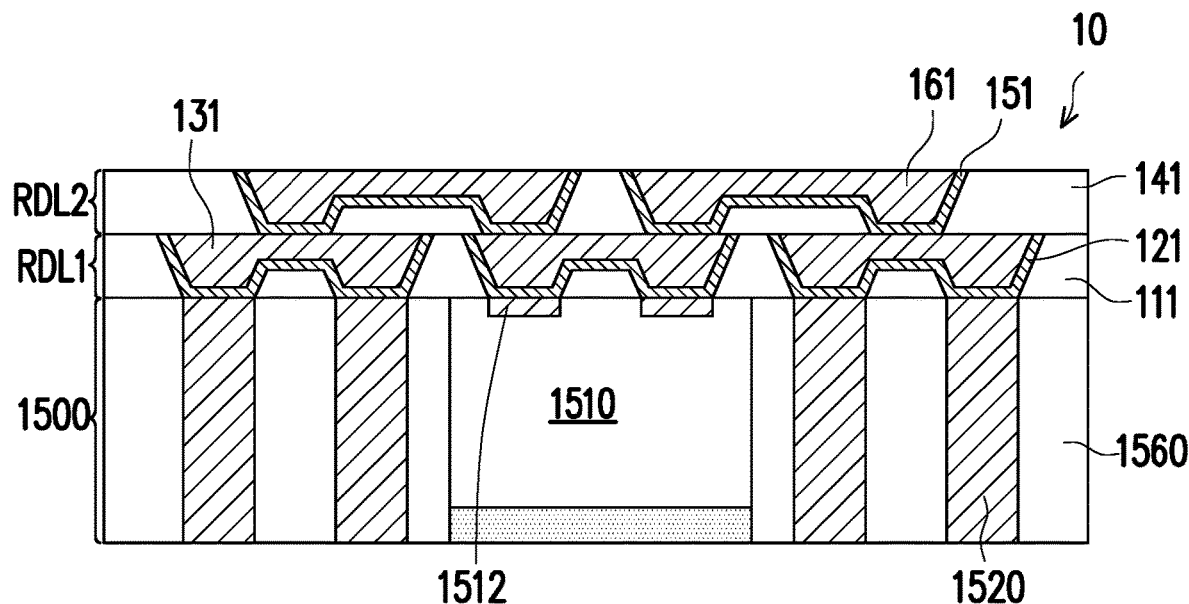
FIG. 16 schematically illustrates a semiconductor package having one or more redistribution layers in accordance with some embodiments.

FIG. 16 schematically illustrates a semiconductor package having one or more redistribution layers in accordance with some embodiments. In some embodiments, after the formation of the second redistribution layer RDL2, the package structure 100 may undergo a dicing process and the package structure 100 is cut into a plurality of packages 10. Referring to FIG. 16, the package 10 includes a package subunit 1500 having a molding compound 1560 and at least one die 1500 and through inter-layer vias (TIVs) 1520 molded in the molding compound 1560. In some embodiments, the first redistribution layer RDL1 is disposed on the molding compound 1560 and on the die 1510 and the TIVs 1520. In some embodiments, the first redistribution layer RDL1 is electrically connected with the contact pads 1512 of the die 1510 and the TIVs 1520. The second redistribution layer RDL2 is disposed on the first redistribution layer RDL1 and is electrically connected with the first redistribution layer RDL1. The structure shown in FIG. 16 may be formed following the processes described in FIGS. 1-14, except for replacing the substrate 102 with the molded package subunit 1500. In some embodiments, the molded package subunit 1500 is provided without the TIVs 1520.

Figure 17:
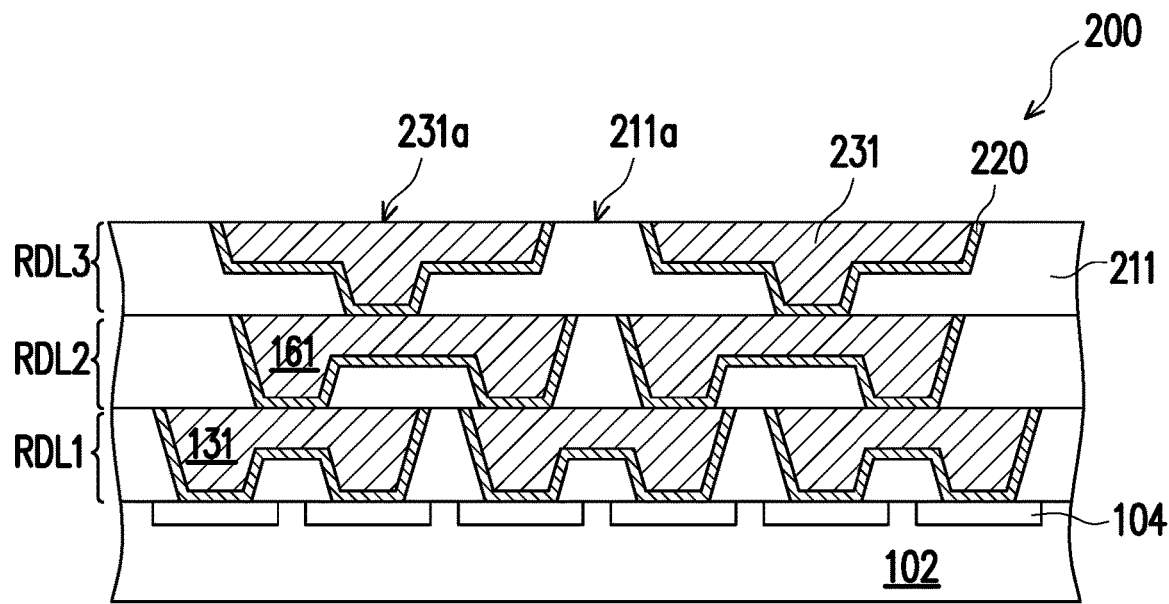
FIGS. 17-20 schematically illustrate various stages of a method of fabricating a semiconductor package in accordance with some embodiments.

FIGS. 17-20 schematically illustrate various stages of a method of fabricating a semiconductor package in accordance with some embodiments. Referring to FIG. 17, a package structure 200 having at least a first redistribution layer RDL1, a second redistribution layer RDL2 and a third redistribution layer RDL3 is provided. The formation of the third redistribution layer RDL3 is similar to the formation of the first redistribution layer RDL1 and the second redistribution layer RDL2. In some embodiments, the third redistribution layer RDL3 may be formed by forming a third dielectric pattern 211, forming third seed metallic patterns 220 and then forming the dual damascene redistribution patterns 231.

Figure 18:
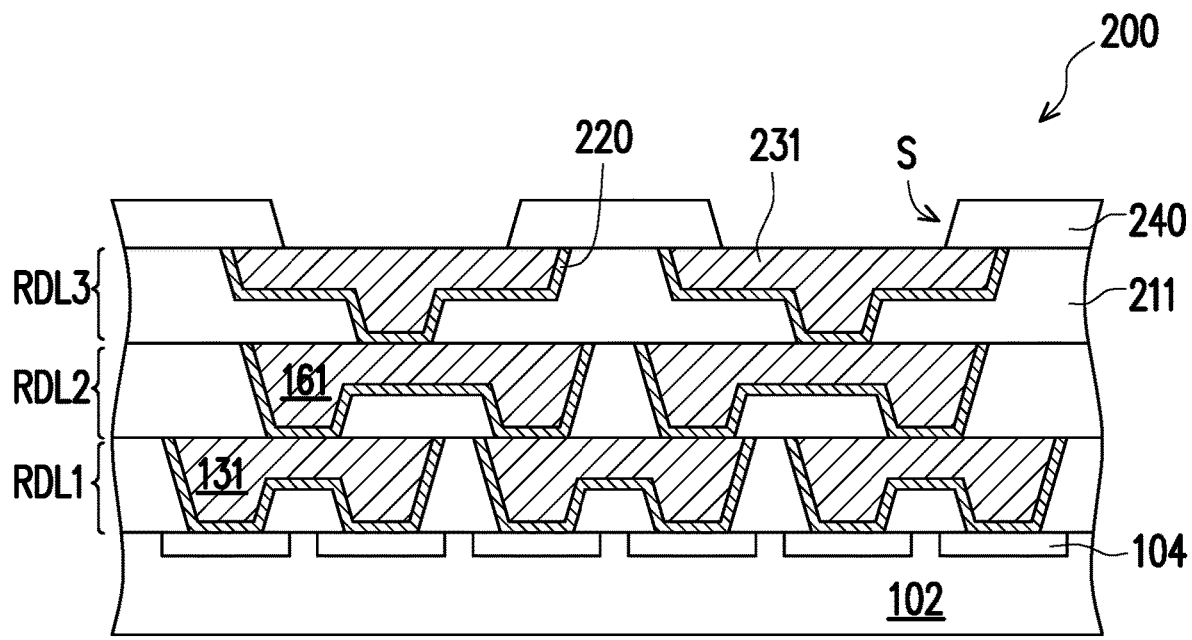

Referring to FIG. 18, a passivation layer 240 with openings S is formed over the third redistribution layer RDL3 to partially expose the dual damascene redistribution patterns 231.

Figure 19:
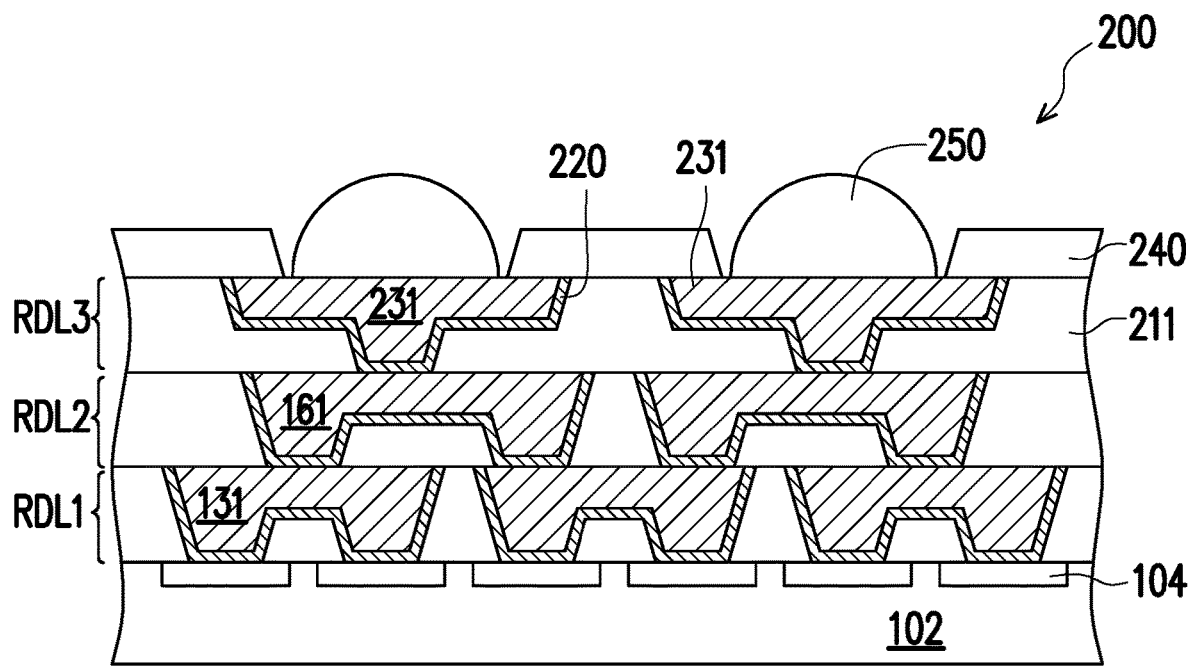

Referring to FIG. 19, conductive elements 250 are formed on the exposed surfaces of the dual damascene redistribution patterns 231 within the openings S of the passivation layer 240.

Figure 20:
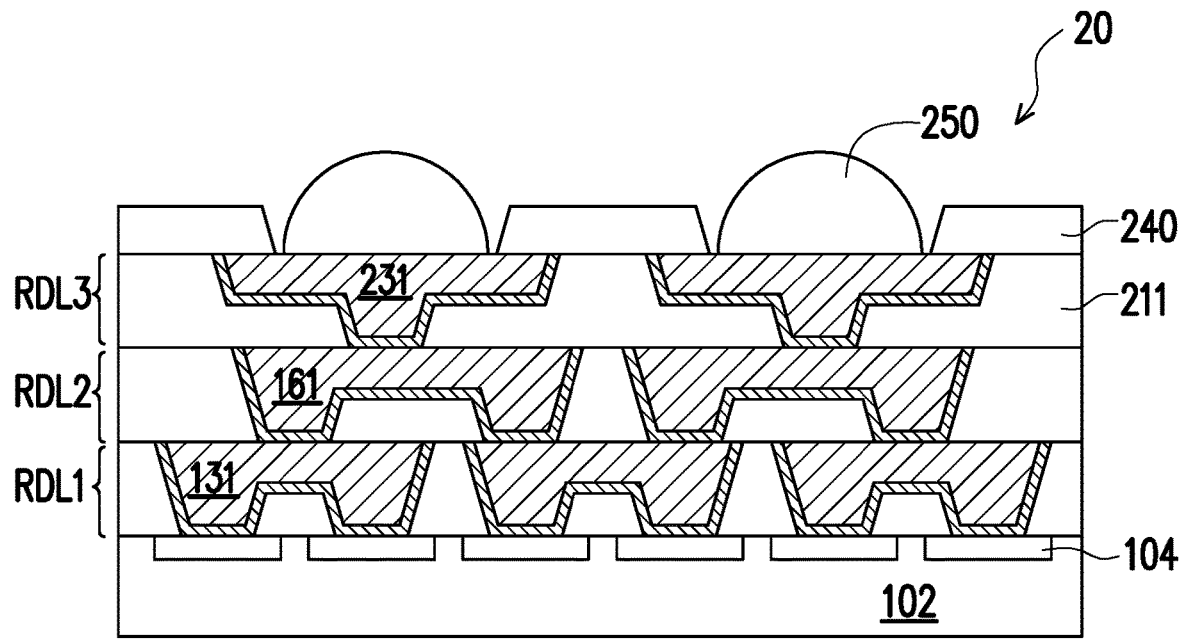

In some embodiments, after the formation of the conductive elements 250 on the third redistribution layer RDL3, the package structure 200 may undergo a dicing process and the package structure 200 is cut into a plurality of packages 20 (only one is shown), in FIG. 20.

Figure 21:
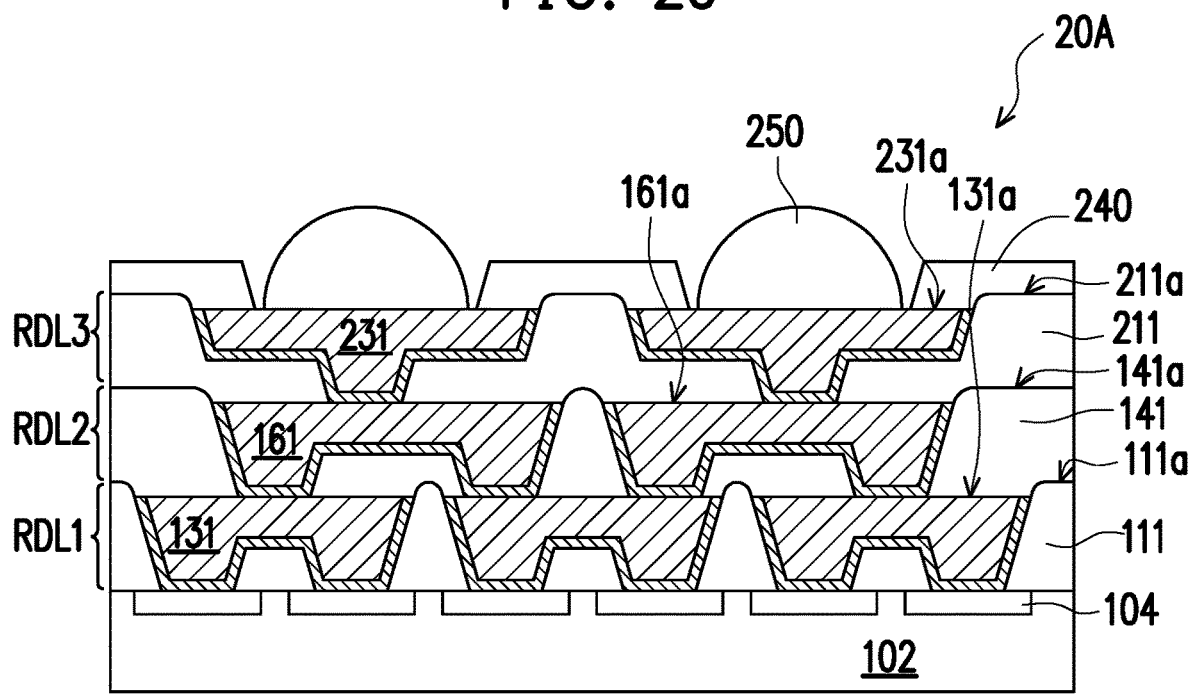
FIG. 21 schematically illustrates a semiconductor package having one or more redistribution layers in accordance with some embodiments.

Referring to FIG. 21, the package 20A includes at least a first redistribution layer RDL1, a second redistribution layer RDL2 and a third redistribution layer RDL3, and the redistribution layers RDL1-RDL3 may be formed following the processes as described in FIGS. 1-14. In some embodiments, the planarization processes performed to remove the extra first, second or third metal layer includes an etching process. Due to the etching back process(es) performed during the formation of the redistribution layers RDL1-RDL3, the top surfaces 131a, 161a, 231a of the dual damascene redistribution patterns 131, 161, 231 are lower than the top surfaces 111a, 141a, 211a of the dielectric patterns 111, 141, 211.

In accordance with some embodiments of the present disclosure, a semiconductor package has at least a redistribution layer located on a substrate. The redistribution layer is electrically connected with contacts of the substrate. The redistribution layer includes a dielectric pattern having a dual damascene opening and a redistribution pattern disposed within the dual damascene opening. The redistribution layer includes a seed metallic pattern sandwiched between the dual damascene opening and the redistribution pattern.

In accordance with alternative embodiments of the present disclosure, a method of fabricating a semiconductor package includes at least the following steps. A substrate having at least one contact is provided and a redistribution layer is formed on the substrate. The formation of the redistribution layer includes forming a dielectric material layer over the substrate and performing a double exposure process to the dielectric material layer. A development process is then performed and a dual damascene opening is formed in the dielectric material layer. A seed metallic layer is formed over the dual damascene opening and over the dielectric material layer. A metal layer is formed over the seed metallic layer. A redistribution pattern is formed in the first dual damascene opening and is electrically connected with the at least one contact.

In accordance with alternative embodiments of the present disclosure, a method of fabricating a semiconductor package includes at least the following steps. A substrate having contacts is provided. A first dielectric material layer is formed over the substrate. A first double exposure process is performed to the first dielectric material layer. A first development process is performed and a first dual damascene opening is formed in the first dielectric material layer exposing the contacts. A first seed metallic layer is formed over the first dual damascene opening and over the first dielectric material layer. A first metal layer is formed on the first seed metallic layer. A first redistribution layer having a first redistribution pattern is formed in the first dual damascene opening. A second dielectric material layer is formed over the first redistribution layer. A second double exposure process is performed to the second dielectric material layer. A second development process is performed and a second dual damascene opening is formed in the second dielectric material layer. A second seed metallic layer is formed over the second dual damascene opening and over the second dielectric material layer. A second metal layer is formed on the second seed metallic layer. A second redistribution layer having a second redistribution pattern is formed in the second dual damascene opening.

In accordance with alternative embodiments of the present disclosure, a method of fabricating a redistribution layer includes at least the following steps. A substrate having contacts is provided. A dielectric material layer is formed on the substrate. A first exposure process is performed with a first energy dose to form first exposure portions with a first depth in the dielectric material layer. A second exposure process is performed with a second energy dose to form second exposure portions with a second depth in the dielectric material layer. The first depth is larger than the second depth and the first energy dose is larger than the second energy dose. The first exposure portions and second exposure portions of the dielectric material layer are removed at the same time to form via openings and trench openings respectively. A seed metallic layer is formed over the dielectric material layer and covers the via openings and trench openings. A metal layer is formed over the seed metallic layer and fills the via openings and the trench openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising
   providing a substrate having at least one contact therein and a dielectric material layer thereon;
   performing a double exposure process to the dielectric material layer including sequentially performing a first exposure process to form first exposure portions in the dielectric material layer and performing a second exposure process to form second exposure portions in the dielectric material layer;
   performing a development process to dissolve the first and second exposure portions and over-develop the dielectric material layer to form a dual damascene opening with a via opening wider than the first exposure portions and a trench opening wider than the second exposure portion;

forming a seed metallic layer over the dual damascene opening and over the dielectric material layer; and forming a metallic pattern filled in the dual damascene opening and electrically connected with the at least one contact.

2. The method as claimed in claim 1, wherein the first exposure portions are formed with a first depth in the dielectric material layer and the second exposure portions are formed with a second depth in the dielectric material layer, and the first depth is larger than the second depth.

3. The method as claimed in claim 2, wherein locations of the first exposure portions are overlapped with locations of the second exposure portions.

4. The method as claimed in claim 1, wherein the first exposure process is performed with a first energy dose and the second exposure process is performed with a second energy dose, and the first energy dose is larger than the second energy dose.

5. The method as claimed in claim 1, wherein the via opening exposes the at least one contact and the trench opening is connected with the at least one via opening.

6. The method as claimed in claim 5, wherein forming a metallic pattern in the dual damascene opening includes forming a via portion located within the via opening and forming a routing portion located within the trench opening.

7. The method as claimed in claim 1, wherein forming a metallic pattern comprises forming a metallic layer filling the dual damascene opening, and performing a planarization process to remove the metallic layer and the seed metallic layer outside the dual damascene opening.

8. A method of forming an interconnection structure, comprising:

providing a substrate having contacts and a dielectric material layer covering the contacts;

performing a first exposure process with a first energy dose to form first exposure portions in the dielectric material layer;

performing a second exposure process with a second energy dose to form second exposure portions in the dielectric material layer, wherein the first energy dose is larger than the second energy dose;

performing a development process dissolving the first exposure portions and the second exposure portions of the dielectric material layer and over-developing the dielectric material layer in the same development process to form via openings larger than the first exposure portions and the trench openings larger than the second exposure portions;

forming a seed metallic layer over the dielectric material layer and covering the via openings and trench openings; and forming metal patterns on the seed metallic layer and filled within the via openings and the trench openings.

9. The method as claimed in claim 8, wherein performing the development process further comprises performing a curing process.

10. The method as claimed in claim 8, wherein the seed metallic layer is formed conformally covering the via openings and the trench openings.

11. The method as claimed in claim 10, wherein the seed metallic layer including titanium and copper is formed by sputtering.

12. The method as claimed in claim 10, wherein the seed metallic layer is formed to cover the contacts exposed by the via openings.

13. The method as claimed in claim 8, wherein forming metal patterns comprises forming a metal layer filling the via openings and the trench openings, and performing a planarization process to remove the metal layer and the seed metallic layer outside the dual damascene opening.

14. The method as claimed in claim 13, wherein the metal layer including copper is formed by electroplating.

15. The method as claimed in claim 8, wherein the first exposure portions are formed at locations overlapped with locations of the second exposure portions.

* * * * *